(12) United States Patent
Xian et al.

(10) Patent No.: US 10,546,880 B2
(45) Date of Patent: Jan. 28, 2020

(54) ARRAY SUBSTRATE AND DISPLAY DEVICE

(71) Applicant: BOE TECHNOLOGY GROUP CO., LTD., Beijing (CN)

(72) Inventors: Jianbo Xian, Beijing (CN); Jian Xu, Beijing (CN); Yong Qiao, Beijing (CN); Yongda Ma, Beijing (CN); Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/940,320

(22) Filed: Mar. 29, 2018

(65) Prior Publication Data

US 2019/0067328 A1 Feb. 28, 2019

(30) Foreign Application Priority Data

Aug. 23, 2017 (CN) ...................... 2017 2 1059813 U

(51) Int. Cl.
*H01L 27/12* (2006.01)
*H01L 23/522* (2006.01)
*H01L 49/02* (2006.01)

(52) U.S. Cl.
CPC ........ *H01L 27/124* (2013.01); *H01L 23/5228* (2013.01); *H01L 27/1255* (2013.01); *H01L 28/20* (2013.01)

(58) Field of Classification Search
None
See application file for complete search history.

(56) References Cited

U.S. PATENT DOCUMENTS

2015/0216045 A1\* 7/2015 Cheng ................. G02F 1/13452
361/748

\* cited by examiner

*Primary Examiner* — Herve-Louis Y Assouman
(74) *Attorney, Agent, or Firm* — Westman, Champlin & Koehler, P.A.

(57) ABSTRACT

An array substrate includes a display region and a non-display region arranged adjacent to the display region. A plurality of signal connection lines is arranged at the non-display region, and each signal connection line is configured to connect a signal source and a signal line at the display region. At least one signal connection line includes a main line portion and at least one resistance adjustment portion connected in parallel to the main line portion.

19 Claims, 3 Drawing Sheets

ARRAY SUBSTRATE AND DISPLAY DEVICE

CROSS-REFERENCE TO RELATED APPLICATION

The present application claims a priority of the Chinese patent application No. 201721059813.3 filed on Aug. 23, 2017, which is incorporated herein by reference in its entirety.

TECHNICAL FIELD

The present disclosure relates to the field of display technology, in particular to an array substrate and a display device.

BACKGROUND

In the related art, in order to prevent the delay of signals from signal sources surrounding a display region of an array substrate to signal lines at the display region, usually it is necessary adjust a resistance of a signal connection line connecting each signal source and the corresponding signal line. Usually, the signal connection line is of a bending shape. However, there is a limited space between the signal source and the corresponding signal line. For some signal connection lines, it is necessary to provide more bending portions so as to balance the resistances. At this time, a larger space for the layout of the signal connection lines is required, and thereby it is adverse to the manufacture of a narrow-bezel display device. In addition, if too many bending portions are arranged in the limited space, such a phenomenon as short-circuit or deficient connection may occur for the signal connection signal, and thereby the display quality of the display device may be adversely affected.

SUMMARY

In one aspect, the present disclosure provides in some embodiments an array substrate including a display region and a non-display region arranged adjacent to the display region. A plurality of signal connection lines is arranged at the non-display region, and each signal connection line is configured to connect a signal source and a signal line at the display region. At least one signal connection line includes a main line portion and at least one resistance adjustment portion connected in parallel to the main line portion.

In a possible embodiment of the present disclosure, the main line portion includes at least one bending portion, and the resistance adjustment portion is connected in parallel to the at least one bending portion.

In a possible embodiment of the present disclosure, the main line portion includes at least two bending portions, the at least two bending portions include a first bending portion and a second bending portion having different lengths; or the at least two bending portions of the signal connection line have an identical length; or the lengths of the at least two bending portions of the signal connection line decrease gradually in a direction close to the signal source; or the at least two bending portions include the first bending portion and the second bending portion having different bending amplitudes.

In a possible embodiment of the present disclosure, the at least one resistance adjustment portion includes a first resistance adjustment portion and a second resistance adjustment portion independent of each other, and an extension direction of the second resistance adjustment portion is not in a same straight line as an extension direction of the first resistance adjustment portion.

In a possible embodiment of the present disclosure, the at least one resistance adjustment portion includes a first resistance adjustment portion and a second resistance adjustment portion independent of each other, and the number of bending portions connected in parallel to the second resistance adjustment portion is different from the number of bending portions connected in parallel to the first resistance adjustment portion.

In a possible embodiment of the present disclosure, the at least one resistance adjustment portion includes a first resistance adjustment portion and a second resistance adjustment portion independent of each other, and a length of each of the bending portions connected in parallel to the second resistance adjustment portion is different from a length of each of the bending portions connected in parallel to the first resistance adjustment portion.

In a possible embodiment of the present disclosure, the at least one resistance adjustment portion includes a first resistance adjustment portion and a second resistance adjustment portion independent of each other, and a position where the second resistance adjustment portion is connected in parallel to the corresponding bending portions is different from a position where the first resistance adjustment portion is connected in parallel to the corresponding bending portions.

In a possible embodiment of the present disclosure, the at least one signal connection line includes a first signal connection line and a second signal connection line, and the signal source includes a first signal source and a second signal source. The first signal connection line includes a first end connected to the first signal source and a second end connected to the signal line. The second signal connection line includes a third end connected to the second signal source and a fourth end connected to the signal line. A distance between the second end and the first signal source is greater than a distance between the fourth end and the second signal source. The number of resistance adjustment portions of the first signal connection line is greater than or equal to the number of resistance adjustment portions of the second signal connection line.

In a possible embodiment of the present disclosure, the at least one signal connection line includes a first signal connection line and a second signal connection line, and the signal source includes a first signal source and a second signal source. A distance between a bending portion of the first signal connection line and the first signal source is greater than a distance between a bending portion of the second signal connection line and the second signal source, and the number of resistance adjustment portions of the first signal connection line is greater than or equal to the number of resistance adjustment portions of the second signal connection line.

In a possible embodiment of the present disclosure, the at least one signal connection line includes a first signal connection line and a second signal connection line, and the signal source includes a first signal source and a second signal source. A bending direction of a bending portion of the first signal connection line is different from a bending direction of a bending portion of the second signal connection line.

In a possible embodiment of the present disclosure, the at least one signal connection line includes a first signal connection line and a second signal connection line, and the signal source includes a first signal source and a second signal source. A size of a bending portion of the first signal connection line is different from a size of a bending portion of the second signal connection line.

In a possible embodiment of the present disclosure, the at least one signal connection line includes a first signal connection line and a second signal connection line, and the signal source includes a first signal source and a second signal source. Bending portions of the first signal connection line are arranged in axisymmetric manner or alternately relative to, or partially overlap bending portions of the second signal connection line.

In a possible embodiment of the present disclosure, the resistance adjustment portion and the bending portion are made of different conductive materials, or arranged at a same layer.

In a possible embodiment of the present disclosure, the first signal source has a voltage value, current value or sequence different from the second signal source.

In a possible embodiment of the present disclosure, the resistance adjustment portion is arranged at a side of the main line portion same as the bending portion, or the resistance adjustment portion is arranged at a region corresponding to the bending portion, or the resistance adjustment portion is arranged at a side of the main line portion different from the bending portion, or the resistance adjustment portion is merely arranged at a region corresponding to the bending portion and in a same straight line as the main line portion.

In a possible embodiment of the present disclosure, the resistance adjustment portion is merely arranged at a region corresponding to the bending portion and in a same straight line as the main line portion.

In a possible embodiment of the present disclosure, the main line portion includes at least two bending portions, and the resistance adjustment portion is connected in parallel to the at least two bending portions.

In a possible embodiment of the present disclosure, the signal source includes at least one of a common voltage signal source, a gate voltage signal source, an initial signal source, a data voltage signal source and a clock signal source.

In a possible embodiment of the present disclosure, the signal source is derived from at least one of a Gate On Array (GOA) circuit, a Chip On Array (COA), and a Chip On Flexible board (COF).

In another aspect, the present disclosure provides in some embodiments a display device including the above-mentioned array substrate.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments.

In order to prevent the delay of signals from signal sources (e.g., data signal Integrated Circuits (ICs)) surrounding a display region of an array substrate to signal lines at the display region, usually it is necessary adjust a resistance of a signal connection line connecting each signal source and the corresponding signal line. Usually, the signal connection line connecting the IC (e.g., the data signal IC) and the signal line is of a bending shape. However, there is a limited space between the signal source and the corresponding signal line. For some signal connection lines, it is necessary to provide more bending portions so as to balance the resistances. At this time, a larger space for the layout of the signal connection lines is required, and thereby it is adverse to the manufacture of a narrow-bezel display device. In addition, if too many bending portions are arranged in the limited space, such a phenomenon as short-circuit or deficient connection may occur for the signal connection signal, and thereby the display quality of the display device may be adversely affected.

An object of the present disclosure is to provide an array substrate and a display device, so as to facilitate the adjustment of the resistance of the signal connection line, thereby to provide the display device with a narrow bezel.

Figure 1:
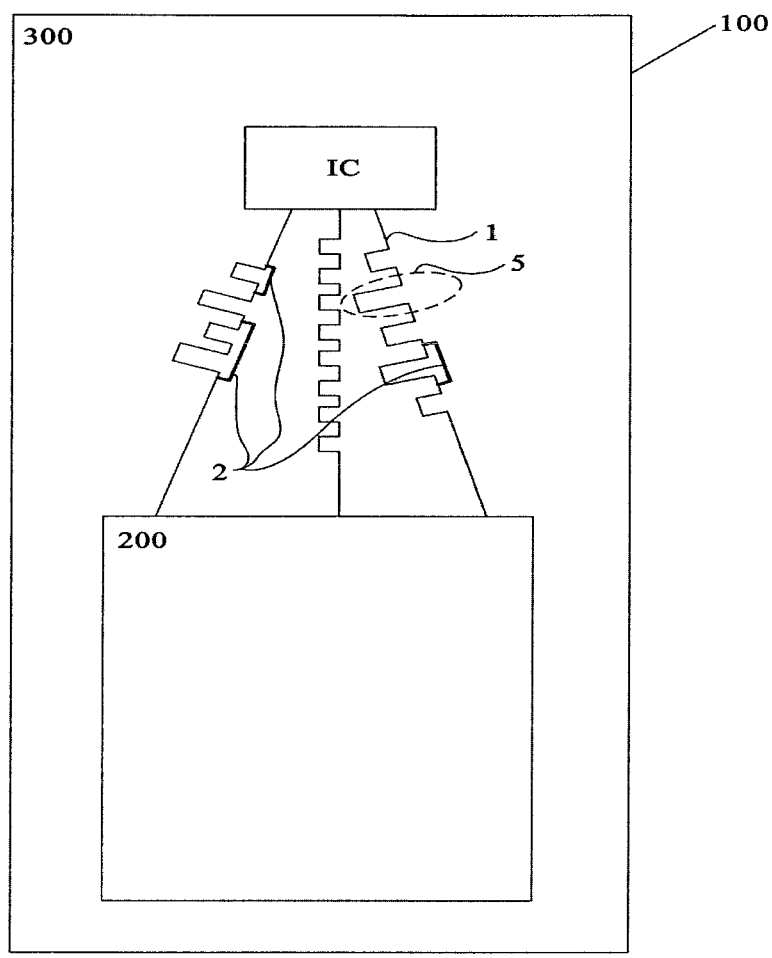
FIG. 1 is a schematic view showing a signal connection line according to one embodiment of the present disclosure.

The present disclosure provides in some embodiments an array substrate 100 which, as shown in FIG. 1, includes a display region 200 and a non-display region 300 arranged adjacent the display region. A plurality of signal connection lines is arranged at the non-display region, and each signal connection line is configured to connect a signal source and a signal line at the display region. At least one signal connection line includes a main line portion 1 and at least one resistance adjustment portion 2 connected in parallel to the main line portion 1.

According to the array substrate in the embodiments of the present disclosure, the signal connection line connecting the signal source and the signal line at the display region includes the main line portion 1 and the resistance adjustment portion 2 connected in parallel to the main line portion 1. In this way, it is able to adjust a resistance of the signal connection line through the resistance adjustment portion 2. In addition, the resistance adjustment portion 2 is connected in parallel to the main line portion 1, so it is able to reduce the resistance of the signal connection line. Further, it is unnecessary to provide the main line portion 1 with too many bending portions to balance the resistance, thereby to reduce a space for the layout of the signal connection line and facilitate the manufacture of a narrow-bezel display device. Also, it is able to prevent the occurrence of such a phenomenon as short-circuit or deficient connection due to the too many bending portions at a limited space, thereby to ensure the display quality of the display device.

Figure 2:
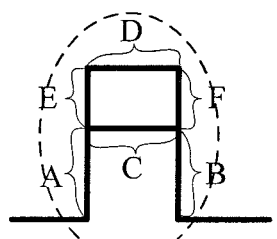
FIGS. 2 and 3 are schematic views showing a situation where a main line portion is connected in parallel to a resistance adjustment portion according to one embodiment of the present disclosure.
Figure 3:
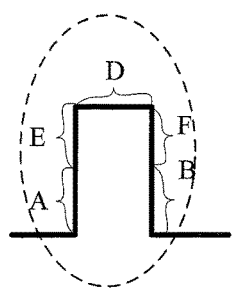

The resistance of the signal connection line may be reduced through the resistance adjustment portion 2, as shown in FIGS. 2 and 3. In the case of no parallel connection, a resistance R1 of a portion in a dotted box in FIG. 3 is equal to Ra+Rb+Rc+Rd+Rf, where Ra represents a resistance of portion A, Rb represents a resistance of portion B, Rc represents a resistance of portion C, Rd represents a resistance of portion D, Re represents a resistance of portion E, and Rf represents a resistance of portion F. In the case of parallel connection, a resistance R2 of a portion in a dotted box in FIG. 2 is equal to Ra+Rb+Rc*(Re+Rd+Rf)/(Rc+Re+Rd+Rf). It can therefore be seen that, R2 is smaller than R1. Hence, through the resistance adjustment portion 2 connected in parallel to the main line portion 1, it is able to reduce the resistance of the signal connection line and optimize the performance of an electric signal transmitted on the signal connection line, thereby to ensure the display quality of the display device.

Figure 4:
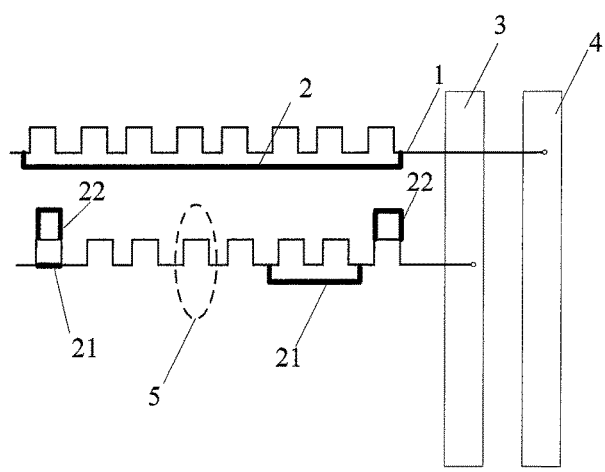
FIGS. 4, 5 and 6 are schematic views showing the signal connection line according to one embodiment of the present disclosure.
Figure 5:
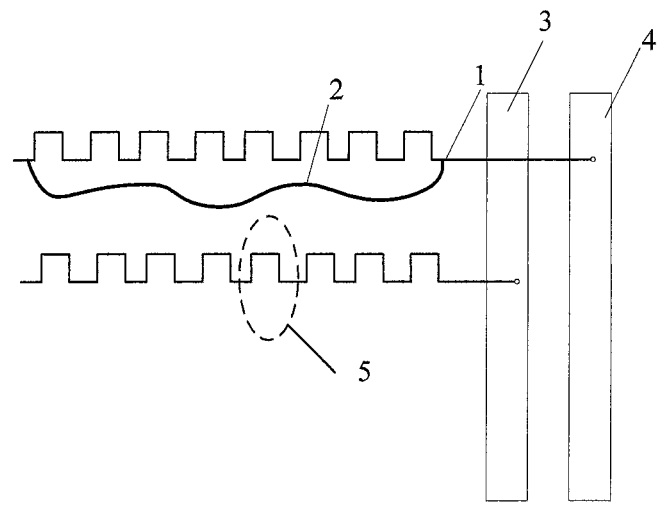

In a possible embodiment of the present disclosure, as shown in FIGS. 1, 2, 4, 5 and 6, the main line portion 1 includes at least one bending portion 5, and the resistance adjustment portion 2 is connected in parallel to the at least one bending portion 5, i.e., the resistance adjustment portion 2 may be connected in parallel to one or more bending portions 5. In another possible embodiment of the present disclosure, each bending portion 5 may be a structure of a square-wave shape, a wavy shape, a folded shape or an arc shape. Bending amplitudes of the bending portions of the main line portion 1 (i.e., distances between maximum bending positions of the bending portions and the main line portion 1) may be same (as shown in FIGS. 4 and 5) or different (as shown in FIG. 1).

Figure 6:
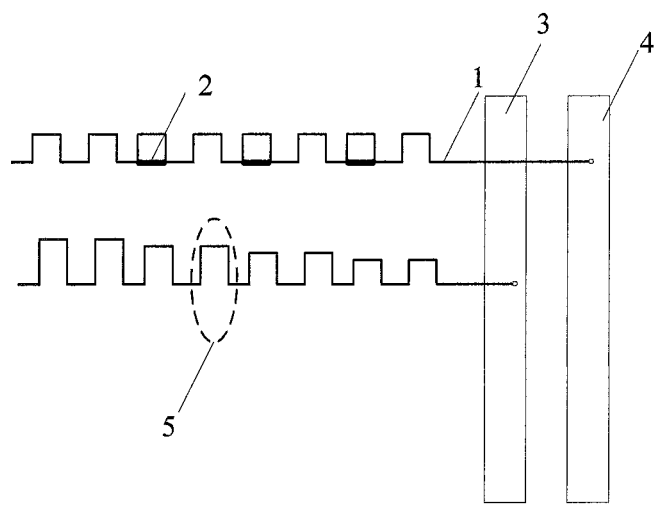

In a possible embodiment of the present disclosure, in the case that the resistance adjustment portion 2 is connected in parallel to the bending portion 5, the resistance adjustment portion 2 may be arranged at a side of the main line portion 1 same as the bending portion 5 (as shown in FIG. 2), or the resistance adjustment portion 2 may be arranged at a region corresponding to the bending portion 5 (as shown in FIG. 2), or the resistance adjustment portion 2 may be arranged at a side of the main line portion 1 different from the bending portion 5 (as shown in FIGS. 1, 4 and 5), or the resistance adjustment portion 2 may be merely arranged at a region corresponding to the bending portion 5 and in a straight line same as the main line portion 1 (as shown in FIG. 6).

In a possible embodiment of the present disclosure, when the main line portion 1 includes at least two bending portions 5, the at least two bending portions 5 include a first bending portion 5 and a second bending portion 5 having different lengths, i.e., the at least two bending portions 5 may have different lengths. In another possible embodiment of the present disclosure, the bending portions 5 of the signal connection line may have an identical length, or the lengths of the bending portions 5 of the signal connection line decrease gradually in a direction close to the signal source, as shown in FIG. 6.

In a possible embodiment of the present disclosure, the at least one resistance adjustment portion 2 includes a first resistance adjustment portion connected in parallel to all the bending portions 5 of the signal connection line, so as to reduce the resistance of the signal connection line to a great extent.

In a possible embodiment of the present disclosure, as shown in FIG. 4, the at least one resistance adjustment portion 2 includes a first resistance adjustment portion 21 and a second resistance adjustment portion 22 independent of each other, and an extension direction of the second resistance adjustment portion 22 is not in a straight line identical to an extension direction of the first resistance adjustment portion 21. For example, the first resistance adjustment portion 21 and the second resistance adjustment portion 22 independent of each other maybe arranged at two sides of the main line portion 1 respectively. Of course, the signal connection line may also include more than two resistance adjustment portions 2, and at this time, the extension directions of these resistance adjustment portions 2 may be not in a same straight line.

In a possible embodiment of the present disclosure, the number of bending portions 5 connected in parallel to the second resistance adjustment portion 22 may be different from the number of bending portions 5 connected in parallel to the first resistance adjustment portion 21; and/or a length of the bending portion 5 connected in parallel to the second resistance adjustment portion 22 may be different from a length of the bending portion 5 connected in parallel to the first resistance adjustment portion 21; and/or a position of the bending portion 5 connected in parallel to the second resistance adjustment portion 22 may be different from a position of the bending portion 5 connected in parallel to the first resistance adjustment portion 21; and/or the extension direction of the bending portion 5 connected in parallel to the second resistance adjustment portion 22 may be different from the extension direction of the bending portion 5 connected in parallel to the first resistance adjustment portion 21.

Of course, the number of bending portions 5 connected in parallel to the second resistance adjustment portion 22 may be same as the number of bending portions 5 connected in parallel to the first resistance adjustment portion 21; and/or the length of the bending portion 5 connected in parallel to the second resistance adjustment portion 22 may be same as the length of the bending portion 5 connected in parallel to the first resistance adjustment portion 21; and/or the position of the bending portion 5 connected in parallel to the second resistance adjustment portion 22 may be same as the position of the bending portion 5 connected in parallel to the first resistance adjustment portion 21; and/or the extension direction of the bending portion 5 connected in parallel to the second resistance adjustment portion 22 may be same as the extension direction of the bending portion 5 connected in parallel to the first resistance adjustment portion 21.

Different signal lines may be connected to different signal sources or the same signal source. The signal source may include a common voltage signal source, a gate voltage signal source, an initial signal source, a data voltage signal source and a clock signal source. For example, one signal connection line may be connected to a first common voltage signal source, and the other signal connection line may be connected to a second common voltage signal source.

In a possible embodiment of the present disclosure, different signal lines include bending portions having a same size and a same number, resistance adjustment portions are used to adjust the resistance of the different signal lines.

In a possible embodiment of the present disclosure, different signal lines include bending portions whose number is decreased from the middle signal connection line to the outer signal connection lines, resistance adjustment portions are used to adjust the resistance of the different signal lines.

In a possible embodiment of the present disclosure, different signal lines include bending portions whose size and number are not limited, resistance adjustment portions are used to adjust the resistance of the different signal lines.

In a possible embodiment of the present disclosure, the signal source may be derived from a driving circuit or chip integrated into the array substrate, e.g., a Gate on Array (GOA) circuit or a chip on array (COG), or a driving circuit or chip bound to a flexible circuit board on the array substrate, e.g., a Chip on Flexible board (COF). To be specific, the signal source may be a data signal IC and a gate signal IC.

As shown in FIG. 4, the signal connection lines are connected to the first signal source 3 and the second signal source 4 respectively, and the resistance adjustment portion 2 of the signal connection line connected to the second signal source 4 is connected in parallel to all the bending portions 5.

In a possible embodiment of the present disclosure, the at least one signal connection line includes a first signal connection line and a second signal connection line. The first signal connection line includes a first end connected to the first signal source and a second end connected to the signal line. The second signal connection line includes a third end connected to the second signal source and a fourth end connected to the signal line. If a distance between the second end and the first signal source is greater than or equal to a distance between the fourth end and the second signal source, the number of the resistance adjustment portions 2 of the first signal connection line may be greater than or equal to the number of the resistance adjustment portions 2 of the second signal connection line, i.e., the signal connection line farther away from the signal source may be provided with more resistance adjustment portions 2. In this way, it is able to reduce a difference between the resistance of the first signal connection line and the resistance of the second signal connection line, thereby to reduce a difference between electric signals transmitted on the signal connection lines.

In a possible embodiment of the present disclosure, a distance between the bending portion 5 of the first signal connection line and the first signal source is greater than a distance between the bending portion 5 of the second signal connection line and the second signal source, and the number of the resistance adjustment portions 2 of the first signal connection line is greater than or equal to the number of the resistance adjustment portions 2 of the second signal connection line, i.e., the signal connection line whose bending portion 5 is farther away from the signal source is provided with more resistance adjustment portions 2. In this way, it is able to reduce the difference between the resistance of the first signal connection line and the resistance of the second signal connection line, thereby to reduce the difference between electric signals transmitted on the signal connection lines.

In a possible embodiment of the present disclosure, a bending direction of the bending portion 5 of the first signal connection line may be different from a bending portion of the bending portion 5 of the second signal connection line; and/or a size of the bending portion 5 of the first signal connection line may be different from a size of the bending portion 5 of the second signal connection line; and/or the bending portions 5 of the first signal connection line are arranged in axisymmetric manner to the bending portions 5 of the second signal connection line; and/or the bending portions 5 of the first signal connection line are arranged alternately relative to the bending portions 5 of the second signal connection line; and/or the bending portions 5 of the first signal connection line are arranged partially overlap the bending portions 5 of the second signal connection line.

In a possible embodiment of the present disclosure, the first signal source has a voltage value, current value or sequence different from the second signal source.

Of course, the bending direction of the bending portion 5 of the first signal connection line may be same as the bending direction of the bending portion 5 of the second signal connection line; and/or the size of the bending portion 5 of the first signal connection line may be same as the size of the bending portion 5 of the second signal connection line.

As shown in FIG. 5, the resistance adjustment portion 2 may be of a wavy shape different from a shape of the bending portion 5. Of course, the resistance adjustment portion 2 may also be of any other shapes, such as a folded shape or an arc shape. In addition, the shape of the resistance adjustment portion 2 may also be same as the shape of the bending portion 5.

In a possible embodiment of the present disclosure, the resistance adjustment portion 2 and the bending portion 5 may be made of different conductive materials, or arranged at a same layer. When the resistance adjustment portion 2 and the bending portion 5 are arranged at different layers, the resistance adjustment portion 2 may be connected to the bending portion 5 through a via-hole.

In a possible embodiment of the present disclosure, the length of the resistance adjustment portion 2 may be same as the length of the bending portion 5, and a width of the resistance adjustment portion 2 may be same as a width of the bending portion 5. In another possible embodiment of the present disclosure, the length and the width of the resistance adjustment portion 2 may be different from those of the bending portion 5 respectively.

The present disclosure further provides in some embodiments a display device including the above-mentioned array substrate. The display device may be any product or member having a display function, such as liquid crystal television, liquid crystal display, organic light-emitting diode display, digital photo frame, mobile phone or flat-panel computer. The display device may further include a flexible circuit board, a printed circuit board and a back plate.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such element as layer, film, region or substrate is arranged "on" or "under" another element, it may be directly arranged "on" or "under" the other element, or an intermediate element may be arranged between the two elements.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An array substrate, comprising a display region and a non-display region arranged adjacent to the display region, wherein a plurality of signal connection lines is arranged at the non-display region, the signal connection line is configured to connect a signal source and a signal line at the display region, and at least one signal connection line comprises a main line portion and at least one resistance adjustment portion connected in parallel to the main line portion, wherein the at least one resistance adjustment portion comprises a first resistance adjustment portion and a second resistance adjustment portion independent of each other.

2. The array substrate according to claim 1, wherein the main line portion comprises at least one bending portion, and the resistance adjustment portion is connected in parallel to the at least one bending portion.

3. The array substrate according to claim 2, wherein the main line portion comprises at least two bending portions, the at least two bending portions comprise a first bending portion and a second bending portion having different lengths; or the at least two bending portions of the signal connection line have a same length; or the lengths of the at least two bending portions of the signal connection line decrease gradually in a direction close to the signal source; or the at least two bending portions comprise the first bending portion and the second bending portion having different bending amplitudes.

4. The array substrate according to claim 2, wherein an extension direction of the second resistance adjustment portion is not in a same straight line as an extension direction of the first resistance adjustment portion.

5. The array substrate according to claim 2, wherein a number of bending portions connected in parallel to the second resistance adjustment portion is different from a number of bending portions connected in parallel to the first resistance adjustment portion.

6. The array substrate according to claim 2, wherein a length of each of the bending portions connected in parallel to the second resistance adjustment portion is different from a length of each of the bending portions connected in parallel to the first resistance adjustment portion.

7. The array substrate according to claim 2, wherein a position where the second resistance adjustment portion is connected in parallel to a corresponding bending portions is different from a position where the first resistance adjustment portion is connected in parallel to the corresponding bending portions.

8. The array substrate according to claim 2, wherein the resistance adjustment portion and the bending portion are made of different conductive materials, or arranged at a same layer.

9. The array substrate according to claim 8, wherein the signal source comprises a first signal source and a second signal source, the first signal source has a voltage value, current value or sequence different from the second signal source.

10. The array substrate according to claim 2, wherein the resistance adjustment portion is arranged at a side of the main line portion same as the bending portion, or the resistance adjustment portion is arranged at a region corresponding to the bending portion, or the resistance adjustment portion is arranged at a side of the main line portion different from the bending portion, or the resistance adjustment portion is merely arranged at a region corresponding to the bending portion and in a same straight line as the main line portion.

11. The array substrate according to claim 1, wherein the main line portion comprises at least two bending portions, and the resistance adjustment portion is connected in parallel to the at least two bending portions.

12. The array substrate according to claim 1, wherein the signal source comprises at least one of a common voltage signal source, a gate voltage signal source, an initial signal source, a data voltage signal source and a clock signal source.

13. The array substrate according to claim 1, wherein the signal source is from at least one of a Gate On Array, a Chip On Array, and a Chip On Flexible board.

14. A display device, comprising the array substrate according to claim 1.

15. An array substrate, comprising a display region and a non-display region arranged adjacent to the display region, wherein a plurality of signal connection lines is arranged at the non-display region, the signal connection line is configured to connect a signal source and a signal line at the display region, and at least one signal connection line comprises a main line portion and at least one resistance adjustment portion connected in parallel to the main line portion,
wherein the main line portion comprises at least one bending portion, and the resistance adjustment portion is connected in parallel to the at least one bending portion,
wherein the resistance adjustment portion is merely arranged at a region corresponding to the bending portion and in a same straight line as the main line portion.

16. An array substrate, comprising a display region and a non-display region arranged adjacent to the display region, wherein a plurality of signal connection lines is arranged at the non-display region, the signal connection line is configured to connect a signal source and a signal line at the display region, and at least one signal connection line comprises a main line portion and at least one resistance adjustment portion connected in parallel to the main line portion,
wherein the main line portion comprises at least one bending portion, and the resistance adjustment portion is connected in parallel to the at least one bending portion;
wherein the at least one signal connection line comprises a first signal connection line and a second signal connection line, and the signal source comprises a first signal source and a second signal source; and
a bending direction or size of a bending portion of the first signal connection line is different from a bending direction or size of a bending portion of the second signal connection line.

17. The array substrate according to claim 16, wherein
the first signal connection line comprises a first end connected to the first signal source and a second end connected to the signal line;
the second signal connection line comprises a third end connected to the second signal source and a fourth end connected to the signal line;
a distance between the second end and the first signal source is greater than a distance between the fourth end and the second signal source; and
a number of resistance adjustment portions of the first signal connection line is greater than or equal to a number of resistance adjustment portions of the second signal connection line.

18. The array substrate according to claim 16, wherein
a distance between a bending portion of the first signal connection line and the first signal source is greater than a distance between a bending portion of the second signal connection line and the second signal source; and
a number of resistance adjustment portions of the first signal connection line is greater than or equal to a number of resistance adjustment portions of the second signal connection line.

19. The array substrate according to claim 16, wherein bending portions of the first signal connection line are arranged in axisymmetric manner or alternately relative to, or partially overlap bending portions of the second signal connection line.

\* \* \* \* \*